United States Patent
Alvi et al.

(10) Patent No.: US 12,000,869 B2
(45) Date of Patent: Jun. 4, 2024

(54) POSITIONING AND CORRECTION OF CURRENT SENSING DEVICES

(71) Applicant: GM GLOBAL TECHNOLOGY OPERATIONS LLC, Detroit, MI (US)

(72) Inventors: Muhammad Hussain Alvi, Troy, MI (US); Suresh Gopalakrishnan, Troy, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 0 days.

(21) Appl. No.: 17/869,120

(22) Filed: Jul. 20, 2022

(65) Prior Publication Data

US 2024/0027501 A1  Jan. 25, 2024

(51) Int. Cl.
*G01R 15/20* (2006.01)
*G01R 19/00* (2006.01)
*G01R 23/02* (2006.01)

(52) U.S. Cl.
CPC ......... *G01R 15/20* (2013.01); *G01R 19/0092* (2013.01); *G01R 23/02* (2013.01)

(58) Field of Classification Search
CPC .............................. G01R 15/20; G01R 19/0092
See application file for complete search history.

(56) References Cited

U.S. PATENT DOCUMENTS

| | | | |
|---|---|---|---|
| 10,666,279 B1* | 5/2020 | Schurmann | H03M 1/1023 |
| 2009/0189553 A1* | 7/2009 | Arnet | H02P 21/22 |
| | | | 318/400.3 |
| 2012/0263985 A1* | 10/2012 | Murata | G01R 15/207 |
| | | | 324/252 |
| 2021/0011058 A1* | 1/2021 | Suzuki | G01R 15/202 |
| 2022/0065900 A1* | 3/2022 | Ding | G01R 19/10 |

* cited by examiner

*Primary Examiner* — Dominic E Hawkins
(74) *Attorney, Agent, or Firm* — CANTOR COLBURN LLP

(57) ABSTRACT

A system includes a current sensor disposed proximate to a first conductor of a conductor assembly, the current sensor configured to measure a current through the first conductor and generate a first current measurement. The system also includes a correction module configured to perform a correction method. The correction method includes determining a frequency of the first current measurement, and applying a gain correction factor to the first current measurement, the gain correction factor based on pre-characterization data relating a gain of a reference current sensor to frequency. In addition, or alternatively, the correction method includes determining a first phase of the first current measurement, acquiring a second current measurement of a second conductor of the conductor assembly, determining a second phase of the second current measurement, and applying a current adjustment to the first current measurement based on a temporal relationship between the first phase and the second phase.

20 Claims, 9 Drawing Sheets

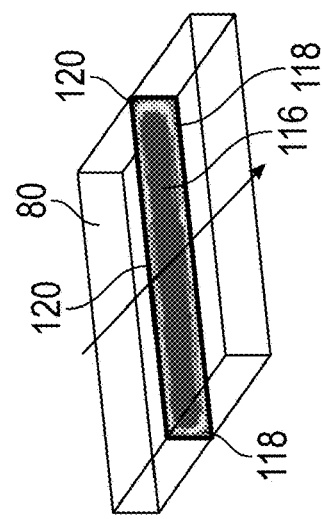
FIG. 4C
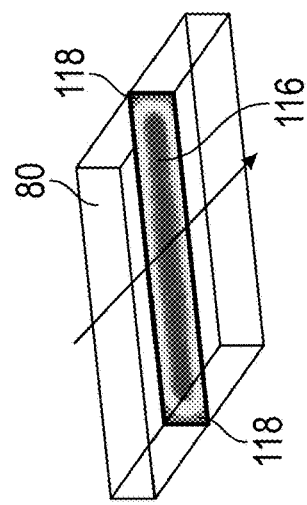
FIG. 4B
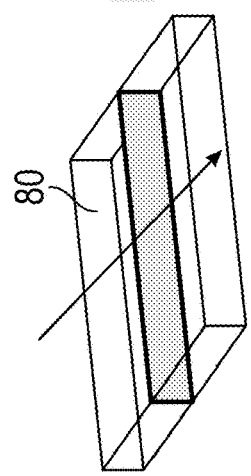
FIG. 4A
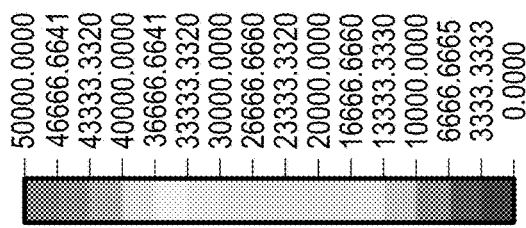

| | RPM | Gain |
|---|---|---|
| 4 | 1500 | 0.9600 |
| 5 | 2000 | 0.9600 |
| 6 | 2500 | 0.9800 |
| 7 | 3000 | 1 |
| 8 | 3500 | 1.0200 |
| 9 | 4000 | 1.0400 |
| 10 | 4500 | 1.0500 |
| 11 | 5000 | 1.0600 |
| 12 | 5500 | 1.0700 |
| 13 | 6000 | 1.0800 |
| 14 | 6500 | 1.0800 |
| 15 | 7000 | 1.0800 |
| 16 | 7500 | 1.0900 |
| 17 | 8000 | 1.1000 |
| 18 | 8500 | 1.1100 |
| 19 | 9000 | 1.1300 |
| 20 | 9500 | 1.1500 |
| 21 | 10000 | 1.1700 |
| 22 | 10500 | 1.1900 |
| 23 | 11000 | 1.2000 |
| 24 | 11500 | 1.2000 |
| 25 | 12000 | 1.1900 |
| 26 | 12500 | 1.1700 |
| 27 | 13000 | 1.1400 |
| 28 | 13500 | 1.1100 |
| 29 | 14000 | 1.0700 |
| 30 | 14500 | 1.0300 |
| 31 | 15000 | 1 |
FIG. 8
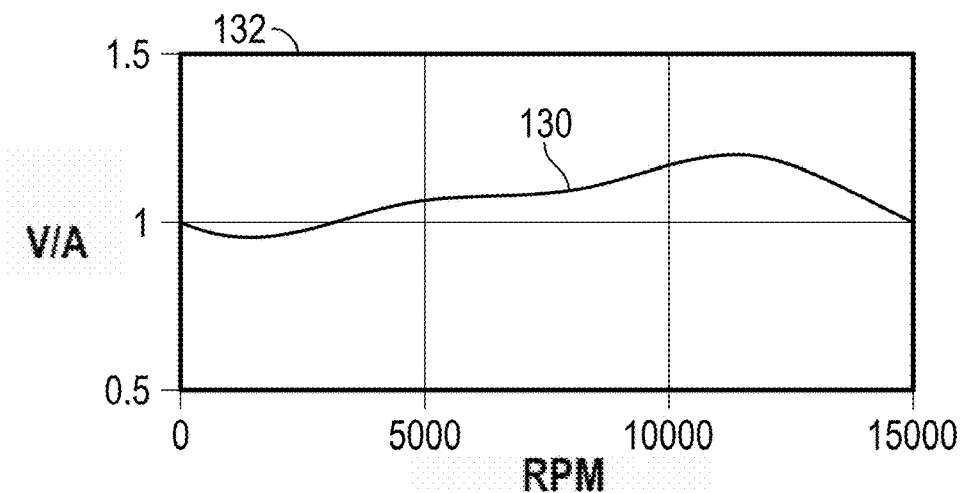
FIG. 9
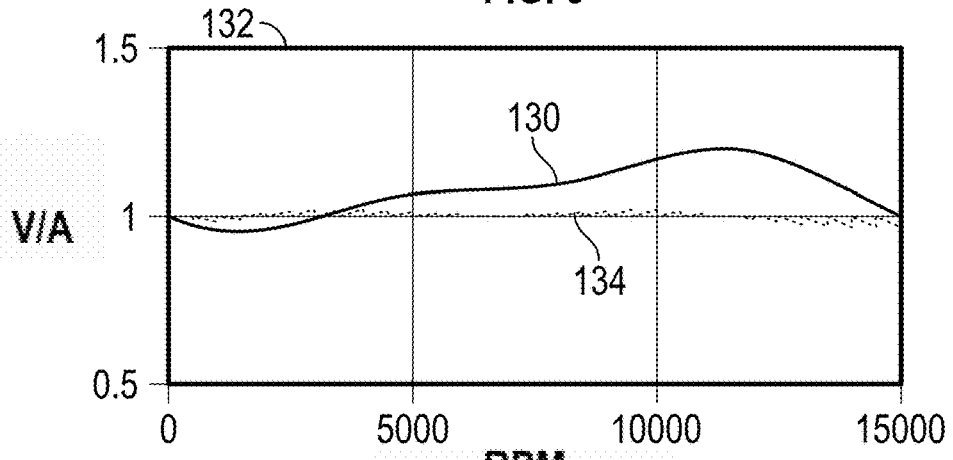
FIG. 10

POSITIONING AND CORRECTION OF CURRENT SENSING DEVICES

INTRODUCTION

The subject disclosure relates to power electronics, and more specifically, to current sensing for control and protection of power electronics.

Vehicles, including gasoline and diesel power vehicles, as well as electric and hybrid electric vehicles, feature battery storage for purposes such as powering electric motors, electronics and other vehicle subsystems. Power electronics (e.g., inverters and DC-DC converters) in a vehicle are responsible for functions such as controlling power and electrical energy to components such as electric motors and other electrical components. Various sensors, including current sensors, are important for ensuring proper function of power electronic devices. For example, current sensors proximate to busbars or other conductors in power inverters are important for effective control of phase currents when driving electric motors.

SUMMARY

In one exemplary embodiment, a system for sensing current includes a current sensor disposed proximate to a first conductor of a conductor assembly, the current sensor configured to measure a current through the first conductor and generate a first current measurement. The system also includes a correction module configured to receive a first current measurement from the current sensor and perform a correction method. The correction method includes determining a frequency of the first current measurement, and applying a gain correction factor to the first current measurement, the gain correction factor based on pre-characterization data relating a gain of a reference current sensor to current frequency. In addition, or alternatively, the correction method includes determining a first phase of the first current measurement, acquiring a second current measurement of a second conductor of the conductor assembly, determining a second phase of the second current measurement, and applying a current adjustment to the first current measurement based on a temporal relationship between the first phase and the second phase.

In addition to one or more of the features described herein, the pre-characterization data is acquired based on measuring a reference current through the reference current sensor at a plurality of frequencies, and deriving a reference gain distribution.

In addition to one or more of the features described herein, the conductor assembly is connected to a power supply and an electric motor, and the reference gain distribution is indicative of gain as a function of speed of the electric motor.

In addition to one or more of the features described herein, the gain correction factor is applied based on a data structure storing a plurality of gain values, each gain value associated with a respective gain correction factor value.

In addition to one or more of the features described herein, the temporal relationship is based on a difference between the first phase and an expected phase of the measured current, the expected phase determined based on a preconfigured phase separation between current applied through the first conductor and current applied through the second conductor.

In addition to one or more of the features described herein, the correction module is configured to apply the gain correction factor and the current adjustment using at least one of a lead and lag filter and a current regulator.

In addition to one or more of the features described herein, the current sensor is a magnetic field sensor.

In addition to one or more of the features described herein, the current sensor is disposed at a location selected based on a strength of a magnetic field around the first conductor and a degree of cross-coupling between the first conductor and the second conductor.

In another exemplary embodiment, a method of sensing current includes measuring a current through a first conductor of a conductor assembly by a current sensor disposed proximate to the first conductor, to generate a first current measurement, and receiving the first current measurement at a correction module and performing a correction method. The correction method includes determining a frequency of the first current measurement, and applying a gain correction factor to the first current measurement, the gain correction factor based on pre-characterization data relating a gain of a reference current sensor to current frequency. In addition, or alternatively, the correction method includes determining a first phase of the first current measurement, acquiring a second current measurement of a second conductor of the conductor assembly, determining a second phase of the second current measurement, and applying a current adjustment to the first current measurement based on a temporal relationship between the first phase and the second phase.

In addition to one or more of the features described herein, the pre-characterization data is acquired based on measuring a reference current through the reference current sensor at a plurality of frequencies, and deriving a reference gain distribution.

In addition to one or more of the features described herein, the conductor assembly is connected to a power supply and an electric motor, and the reference gain distribution is indicative of gain as a function of speed of the electric motor.

In addition to one or more of the features described herein, the gain correction factor is applied based on a data structure storing a plurality of gain values, each gain value associated with a respective gain correction factor value.

In addition to one or more of the features described herein, the temporal relationship is based on a difference between the first phase and an expected phase of the measured current, the expected phase determined based on a preconfigured phase separation between the current applied through the first conductor and current applied through the second conductor.

In addition to one or more of the features described herein, the gain correction factor and the current adjustment are applied using at least one of a lead and lag filter and a current regulator.

In addition to one or more of the features described herein, the current sensor is a magnetic field sensor, and the current sensor is disposed at a location selected based on a strength of a magnetic field around the conductor and a degree of cross-coupling between the first conductor and the second conductor.

In yet another exemplary embodiment, a vehicle system includes a memory having computer readable instructions, and a processing device for executing the computer readable instructions, the computer readable instructions controlling the processing device to perform a method. The method includes measuring a current through a first conductor of a conductor assembly by a current sensor disposed proximate to the first conductor, to generate a first current measurement, and receiving the first current measurement at a correction module and performing a correction method. The correction method includes determining a frequency of the first current measurement, and applying a gain correction factor to the first current measurement, the gain correction factor based on pre-characterization data relating a gain of a reference current sensor to current frequency. In addition, or alternatively, the correction method includes determining a first phase of the first current measurement, acquiring a second current measurement of a second conductor of the conductor assembly, determining a second phase of the second current measurement, and applying a current adjustment to the first current measurement based on a temporal relationship between the first phase and the second phase.

In addition to one or more of the features described herein, the pre-characterization data is acquired based on measuring a reference current through the reference current sensor at a plurality of frequencies, and deriving a reference gain distribution.

In addition to one or more of the features described herein, the conductor assembly is connected to a power supply and an electric motor, and the reference gain distribution is indicative of gain as a function of speed of the electric motor.

In addition to one or more of the features described herein, the gain correction factor is applied based on a data structure storing a plurality of gain values, each gain value associated with a respective gain correction factor value.

In addition to one or more of the features described herein, the temporal relationship is based on a difference between the first phase and an expected phase of the measured current, the expected phase determined based on a preconfigured phase separation between the current applied through the first conductor and current applied through the second conductor.

The above features and advantages, and other features and advantages of the disclosure are readily apparent from the following detailed description when taken in connection with the accompanying drawings.

BRIEF DESCRIPTION OF THE DRAWINGS

Other features, advantages and details appear, by way of example only, in the following detailed description, the detailed description referring to the drawings in which:

FIGS. 4A-4C depict examples of current density through a conductor;

FIG. 8 depicts an example of a lookup table including gain correction factor values, generated based on the reference gain distribution of FIG. 7;

FIG. 9 depicts an example of an output of a current sensor indicative of current measurements;

FIG. 10 depicts an example of correction of the output of FIG. 9 using a gain correction factor;

DETAILED DESCRIPTION

Figure 1:
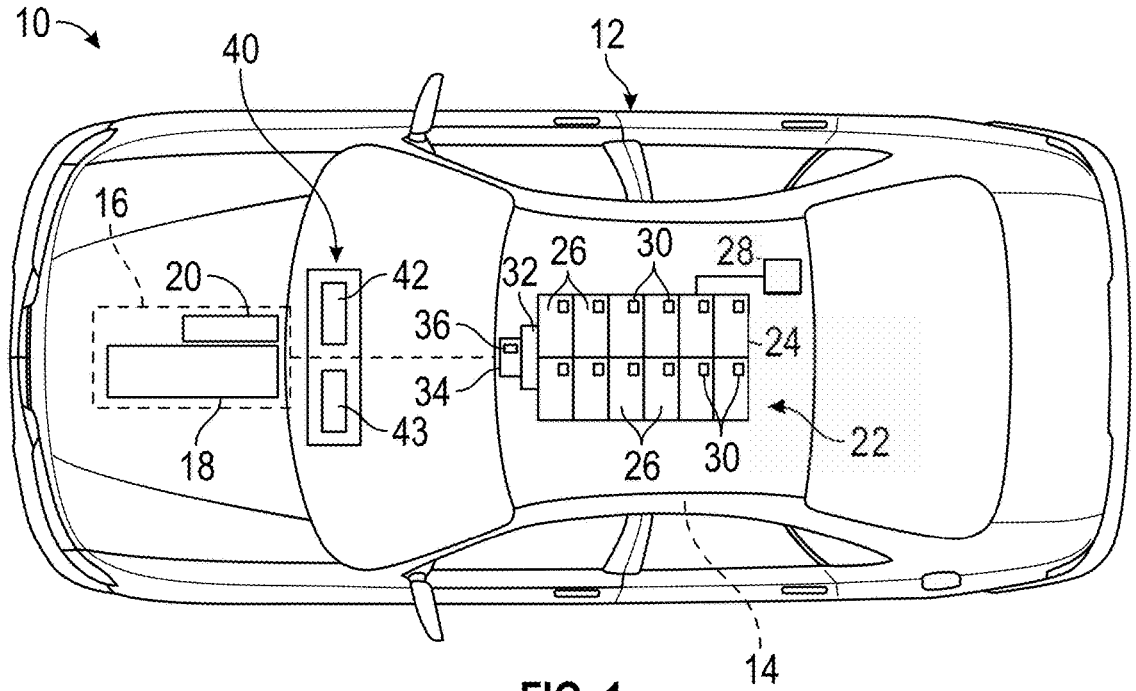
FIG. 1 is a top view of a motor vehicle, in accordance with an exemplary embodiment.

The following description is merely exemplary in nature and is not intended to limit the present disclosure, its application or uses. It should be understood that throughout the drawings, corresponding reference numerals indicate like or corresponding parts and features.

In accordance with an exemplary embodiment, methods, devices and systems are provided for current sensing. An embodiment of a current sensing system includes one or more current sensors disposed proximate to a conductor, and a control device or controller (also referred to as a correction module). The current sensing system may be incorporated as part of, or connected to, a power conversion device such as an inverter of a vehicle that is connected to an electric motor.

An embodiment of a method of correcting or compensating current measurements from a current sensor includes correcting an output of the current sensor to compensate for gain errors, and/or correcting the output to compensate for phase delays. Gain correction is performed based on pre-characterization data, such as data related to a frequency response of a reference sensor (e.g., gain as a function of frequency). Phase correction is performed based on a temporal relationship between a current measurement for a given phase signal (e.g., one phase of a three-phase inverter output) and another phase signal. The phase and gain correction serves to null or reduce skin and proximity effects on gain and phase of current sensors, such as point field detection (PFD) sensors.

An embodiment of the current sensing system includes a current sensor (e.g., a magnetic field detector) that is positioned relative to a conductor based on an analysis of field strength of the conductor and/or cross coupling between the conductor and another conductor. For example, a current sensing system includes a current sensor disposed proximate to each conductor of a three-phase busbar assembly. Each sensor is positioned relative to a respective conductor at a location corresponding to high field strength and low cross coupling.

Embodiments described herein present numerous advantages and technical effects. The embodiments provide for effective correction of errors in current sensors, which can be severe in sensors such as PFD sensors. In addition, the embodiments allow for positioning PFD and/or other sensors relative to conductors based on field strength to increase the accuracy of current sensing, which is advantageous over current sensor positioning based on bandwidth. Such increases in accuracy lead to precise motor control, which in turn lead to more effective torque response of a vehicle.

The embodiments are not limited to use with any specific vehicle or electronic device, and may be applicable to various contexts. For example, embodiments may be used with automobiles, trucks, aircraft, construction equipment, farm equipment, automated factory equipment and/or any other device or system for which additional thermal control may be desired to facilitate a device or system's existing thermal control capabilities or features.

FIG. 1 shows an embodiment of a motor vehicle 10, which includes a vehicle body 12 defining, at least in part, an occupant compartment 14. The vehicle body 12 also supports various vehicle subsystems including a propulsion system 16, and other subsystems to support functions of the propulsion system 16 and other vehicle components, such as a braking subsystem, a suspension system, a steering subsystem, a fuel injection subsystem, an exhaust subsystem and others.

The vehicle 10 may be a combustion engine vehicle, an electrically powered vehicle (EV) or a hybrid vehicle. In an embodiment, the vehicle 10 is a hybrid vehicle that includes a combustion engine assembly 18 and at least one electric motor assembly. In this embodiment, the propulsion system 16 includes an electric motor 20, and may include one or more additional motors positioned at various locations.

The vehicle 10 includes a battery system 22, which may be electrically connected to the motor 20 and/or other components, such as vehicle electronics. The battery system 22 may be configured as a rechargeable energy storage system (RES S).

In an embodiment, the battery system 22 includes a battery assembly such as a high voltage battery pack 24 having a plurality of battery modules 26. Each of the battery modules 26 includes a number of individual cells (not shown). The battery system 22 may also include a monitoring unit 28 configured to receive measurements from sensors 30. Each sensor 30 may be an assembly or system having one or more sensors for measuring various battery and environmental parameters, such as temperature, current and voltages. The monitoring unit 28 includes components such as a processor, memory, an interface, a bus and/or other suitable components.

The battery system 22 is electrically connected to a DC-DC converter module 32 and an inverter module 34. The inverter module 34 (e.g., a traction power inverter unit or TPIM) converts direct current (DC) power from the battery system 22 to three-phase alternating current (AC) power to drive the motor 20. In an embodiment, the inverter module 34 includes an inverter 36 connected to the DC-DC-converter module 34 for receiving DC power, and is connected to the motor 20 for providing three-phase AC power thereto.

The vehicle 10 also includes a computer system 40 that includes one or more processing devices 42 and a user interface 43. The various processing devices and units may communicate with one another via a communication device or system, such as a controller area network (CAN) or transmission control protocol (TCP) bus.

Figure 2:
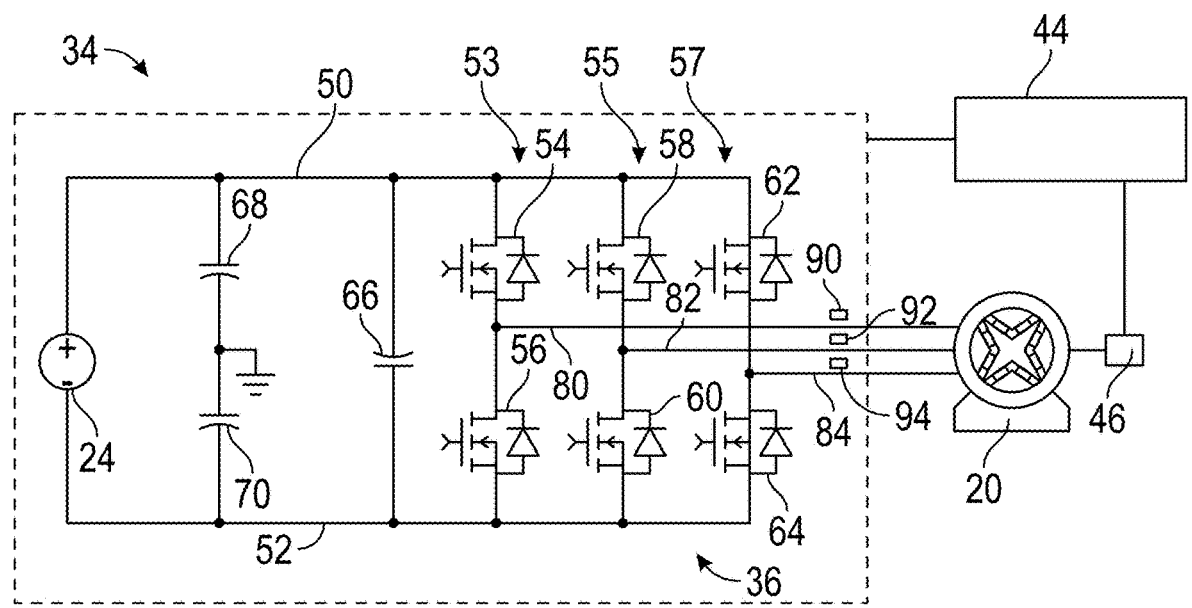
FIG. 2 schematically depicts components of an inverter module including a current measurement and/or control system, in accordance with an exemplary embodiment.

FIG. 2 schematically illustrates components of an embodiment of the propulsion system 16, including the inverter module 34, the motor 20 and a control device or controller 44. The inverter module 34 includes a three-phase inverter circuit (inverter 36). The inverter module 34 may be incorporated into the vehicle 10, another vehicle or any other system.

The controller 44 is configured to perform functions including sensor correction as described herein. The controller 44 may also control functions of the inverter 36 and/or the motor 20. The controller 44 may be part of an electronic control unit (ECU), motor controller, TPIM controller, or may be a separate dedicated controller.

The controller 44 is configured to receive sensor data from the inverter module 34 and the motor 20, and can use such data to control the inverter 36 (e.g., control switches), motor operation and others. In an embodiment, the controller 44 is configured to perform aspects of a method of correcting current sensor data as described herein. The controller 44 performs the method using sensor data as well as other parameters, such as a motor speed parameter derived from position measurements.

Position measurements may be taken from a position sensor, such as a resolver 46. The resolver 46 is used to monitor angular position of the motor's rotor, which can be used to control the inverter module 34, and is also used to determine motor speed.

The inverter 36 includes three sets of switches connected in parallel to a positive DC bus 50 and a negative DC bus 52. The buses 50 and 52 may be configured as busbars of any desired type or configuration. Each set of switches is in a half-bridge configuration. A first set of switches 54 and 56 is connected to a first motor phase (phase A), a second set of switches 58 and 60 connected to a second motor phase (phase B), and a third set of switches 62 and 64 is connected to a third motor phase (phase C). In an embodiment, the sets of switches are incorporated into one or more switching modules. For example, the first set of switches 54 and 56 is incorporated into a first switching module 53, the second set of switches 58 and 60 is incorporated into a second switching module 55, and the third set of switches 62 and 64 is incorporated into a third switching module 57.

The inverter module 34 also includes various capacitors for stabilizing operation. In an embodiment, the inverter module 34 includes a bulk DC capacitor 66 (line-to-line capacitor), also referred to as a Class X capacitor or simply X capacitor (XCap). The inverter module 34 also includes two bypass capacitors 68 and 70 (line-to-ground capacitors), also referred to as Class Y capacitors or simply Y capacitors (YCap).

Each set of switches is connected by a conductor to a phase of the motor 20. For example, the first set of switches 54 and 56, and/or the switching module 53, is connected by a conductor 80 to a first phase (phase A) of the motor 20. The second set of switches 58 and 60, and/or the switching module 55, is connected by a conductor 82 to a second phase (phase B). The third set of switches 62 and 64, and/or the switching module 55, is connected by a conductor 84 to a third phase (phase C). The conductors may be configured as busbars, for example, as parallel busbars (See, e.g., FIG. 3).

Various sensors (e.g., voltmeters, current sensors, etc.) are disposed relative to components of the inverter module 34. In an embodiment, one or more current sensors are disposed proximate to conductors. As referred to herein, a "proximate" location is a distance and/or location relative to a conductor that is selected for effective current sensing. For example, each sensor may be positioned relative to a respective conductor to increase or maximize field strength, and to reduce or eliminate cross coupling effects from adjacent conductors. In an embodiment, a current sensor is disposed proximate to each conductor and/or busbar.

For example, a first current sensor 90 is positioned proximate to the conductor 80, a second current sensor 92 is positioned proximate to the conductor 82, and a third current sensor 94 is positioned proximate to the conductor 84.

Figure 3:
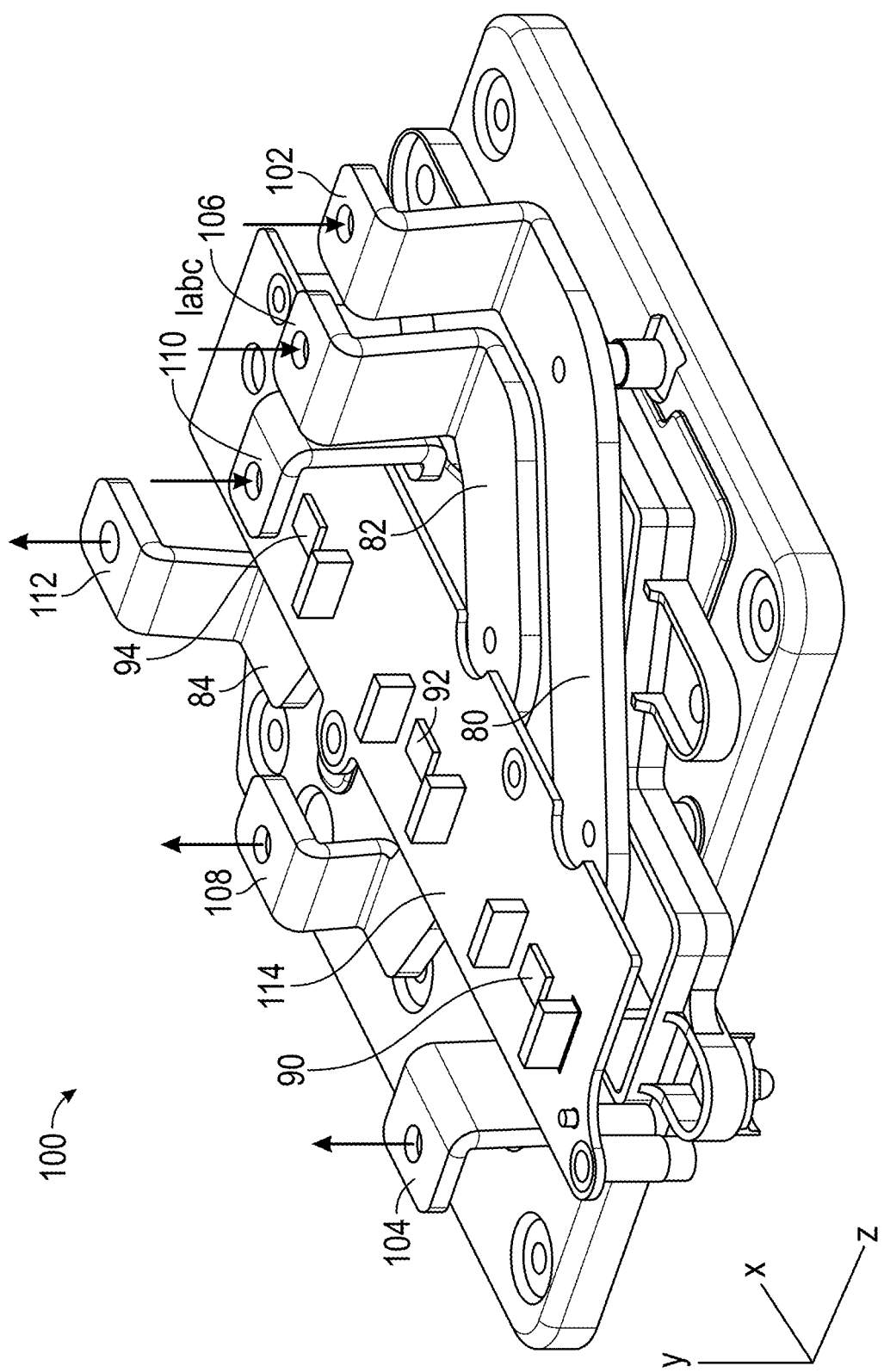
FIG. 3 depicts a busbar assembly configured to connect a three-phase output from the inverter module of FIG. 2, in accordance with an exemplary embodiment.

FIG. 3 depicts an example of a configuration of the conductors connected to the motor 20, as well as an example of positions of the current sensors. In this example, the conductors 80, 82 and 84 are configured as parallel busbars in a busbar assembly 100. The conductor 80 is configured as a phase A busbar 80, which includes an input terminal 102 for receiving phase current and an output terminal 104 for outputting the phase current to the motor 20. The conductor 82 is configured as a phase B busbar 82 having an input terminal 106 and an output terminal 108, and the conductor 84 is configured as a phase C busbar 84 having an input terminal 110 and an output terminal 112.

Each sensor 90, 92, 94 is positioned at a selected location relative to a respective busbar (e.g., on a printed circuit board (PCB) 114 (also referred to as a sensing PCB 114)). In the example of FIG. 3, each sensor 90, 92, 94 is positioned above a respective conductor, but is not so limited. For example, a given current sensor may be positioned at any suitable location relative to a conductor (e.g., above, below, near a side). In an embodiment, each sensor 90, 92, 94 is positioned at a location selected based on field strength (e.g., the location is a location of high field strength) and cross-coupling (e.g., the location is a location where cross coupling between adjacent conductor is low).

Each current sensor 90, 92, 94 may be any suitable type of sensor. In an embodiment, a current sensor is or includes a magnetic field sensor. Examples of magnetic field sensors include core and coreless PFD sensors, hall effect sensors and magnetoresistive sensors (e.g., giant magnetoresistive, tunnel magnetoresistive and anisotropic magnetoresistive sensors).

Current sensors (cored and coreless) that sense current based on magnetic field are subject to frequency dependent errors. Such errors may be due to current density accumulation in conductors (e.g., rectangular cross-section copper busbars) that can introduce errors in both phase and gain of current measurements. FIGS. 4A-4C depict examples of density accumulation in a cross-section of a rectangular copper conductor, such as the phase A busbar 80. Current density J (in A/m2) is coded as shown in the displayed legend. FIG. 4A shows the current density of quasi-direct current at one amp; as can be seen, the density is generally evenly distributed. FIG. 4B shows a one-amp current having a 10 kHz frequency, where the current density is low in a central region of the busbar (region 116) and high at end regions 118. FIG. 4C shows the current density of a one-amp current at 1 MHz. The higher frequency results in a different density distribution, where density is highest at both end regions 118 and at upper and lower edge regions 120. A similar distribution can be found for magnetic flux.

In an evenly distributed current density, both the phase and gain of a current sensor should be constant over a given frequency range (e.g., the gain is 1 or about 1). However, due to the uneven distribution, phase and gain errors arise.

In an embodiment, the controller 44, or other suitable controller or processing device, is configured to perform a correction method to correct for the above effects and associated errors. The correction method may include correction of sensor gain and/or sensor phase errors. For gain correction, the controller 44 utilizes a correction factor that is based on previously acquired sensor data and/or simulations (pre-characterization data). For phase correction, the method corrects for phase shift (e.g., lag or gain) based on the temporal relationship between phase currents.

FIGS. 5-8 depict aspects of a method of generating data used for gain correction, which may be performed by a motor controller, the controller 44 or other processing device. The gain correction method is based on acquiring pre-characterization data by measuring or modeling/simulating a frequency response of a reference current sensor. The reference current sensor may be the same as the sensor used during operation, or a similar sensor.

Figure 5:
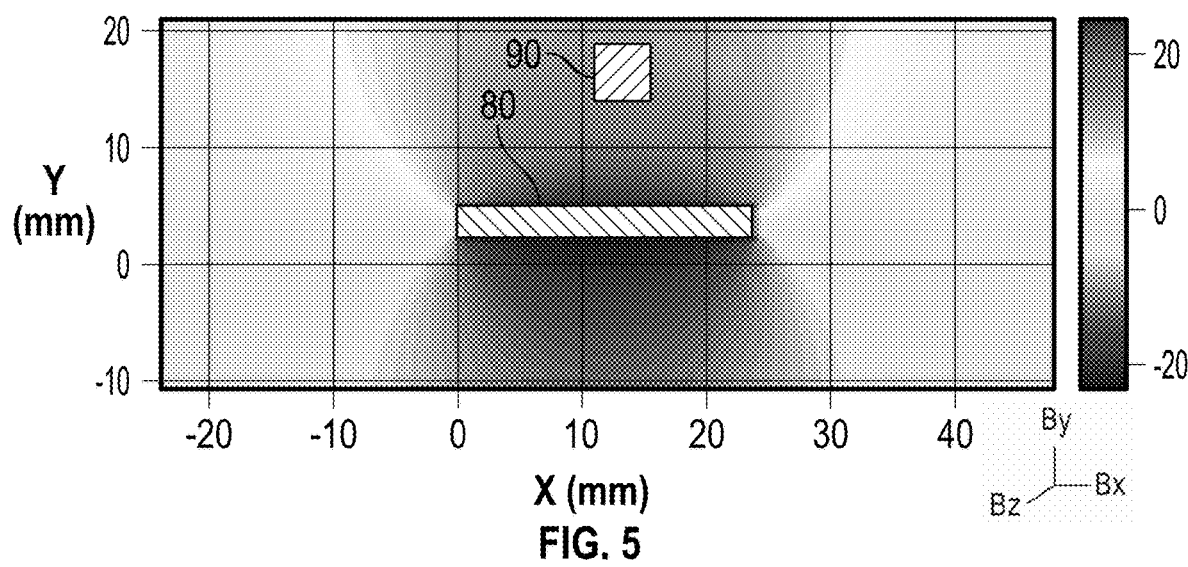
FIG. 5 depicts a cross-section of a conductor and a current sensor positioned proximate thereto, including a representation of a magnetic field, in accordance with an exemplary embodiment.

A reference sensor setup is acquired. FIG. 5 shows an example of a reference PFD sensor setup that includes a conductor (e.g., busbar 80) and a PFD sensor (e.g., sensor 90) disposed at a desired location. The sensor 90 is positioned above and central to the busbar 80 near a region of high magnetic field (Bi, having components Bx, By and Bz). In this example, the busbar 80 has a cross-sectional width of about 25 mm and a cross-sectional height of about 2.5 mm. Magnetic field strength Bx and By is shown as a coding with an associated legend. As can be seen, a region directly above the conductor has high magnetic field strength, and a region below has a low magnetic field strength.

Figure 6:
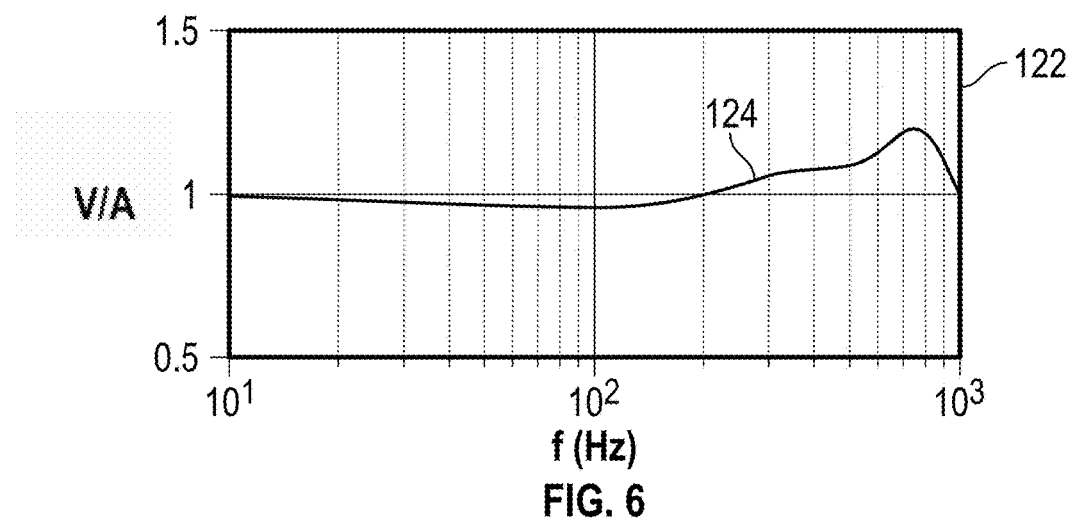
FIG. 6 depicts an example of a current sensor output distribution as a function of frequency.

To generate the pre-characterization data, the test setup is subject to test currents having different frequencies, and a frequency response distribution (gain as a function of frequency) is derived. An example of a frequency response distribution is shown in FIG. 6, which shows a graph 122 of PFD output (gain) in Volts/Amp as a function of frequency (in Hz). A gain-frequency curve 124 represents the frequency response distribution. The frequency response distribution can be experimentally determined as described herein, and/or modeled (e.g., using finite element analysis).

Figure 7:
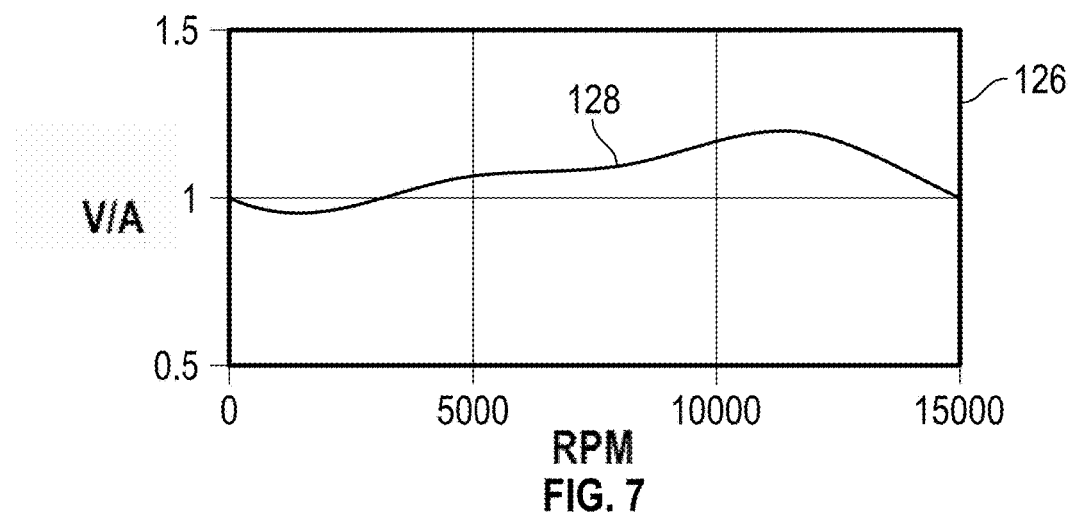
FIG. 7 depicts an example of a current sensor output distribution as a function of motor speed, which may be used as a reference gain distribution to derive gain correction factors, in accordance with an exemplary embodiment.

The frequency response distribution of FIG. 6 may be converted to gain as a function of motor 20 and/or resolver 46 speed, to generate a reference gain distribution. FIG. 7 includes a graph 126 of PFD output as a function of motor speed as determined via a resolver or other suitable position or speed sensor. The graph 126 shows an example of a reference gain distribution in the form of a gain-speed curve 128 derived from the information represented in FIG. 6.

It is noted that, although the gain-speed curve 128 or other gain-speed distribution is described as the reference gain distribution, the method is not so limited. For example, the frequency response distribution (e.g., the gain-frequency curve 124) may be used as a reference gain distribution.

Data relating speed to gain may be extracted from the distribution. For example, a lookup table (LUT) or other data structure is generated that allows the processor to apply a gain correction factor. An example of a lookup table including exemplary gain correction factors is shown in FIG. 8.

Figure 11:
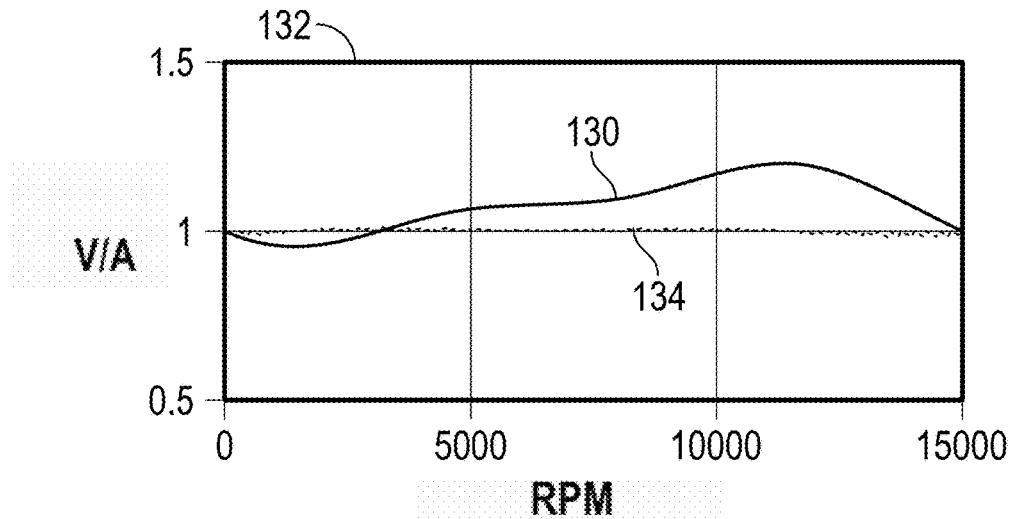
FIG. 11 depicts an example of correction of the output of FIG. 9 using a gain correction factor.

FIGS. 9-11 depict examples of gain correction of a measured current. In these examples, a processing device acquires PFD sensor current measurements, as well as voltage and motor speed. The acquired measurements are used to calculate a measured distribution relating sensor gain to motor speed. An example of a measured distribution is shown in FIG. 9 as a gain-speed curve 130 shown in a graph 132.

To compensate current measurements, the processing device applies values of the gain correction factor from the LUT or other data structure. FIG. 10 shows an example of a compensated sensor output 134, which has been corrected or adjusted at a first resolution using 30 frequency points. FIG. 11 shows another example of the compensated sensor output 134 at a second resolution using 60 frequency points.

In an embodiment, the processing device is configured to perform a phase compensation method based on a temporal relationship between the phase of a measured current (measured phase) and the phase of a current from another conductor (reference phase). For example, the measured phase through the phase A busbar 80 is corrected for phase errors by comparing the measured phase current through the phase C busbar 84 (reference phase), taking into account a preselected or pre-configured phase separation (e.g., 120 degrees). Based on the comparison, a phase error of the measured current is determined and used to correct the measured current.

Figure 12:
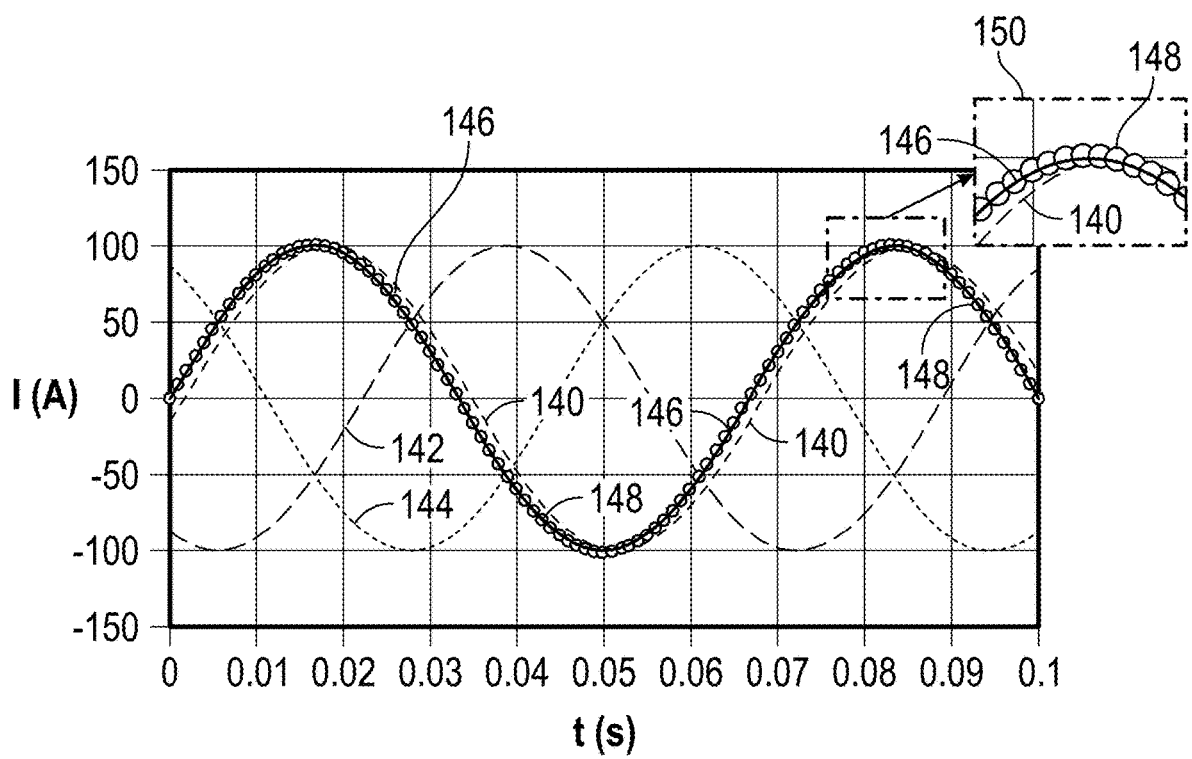
FIG. 12 depicts an example of three phase currents measured by respective current sensors, and depicts aspects of correction of a current measurement based on a temporal relationship between individual phase currents, in accordance with an exemplary embodiment.

FIG. 12 shows an example of currents through the busbars 80, 82 and 84 and depicts aspects of phase correction. In this example, current is measured through each busbar, and the phase of current through the conductor 84 (phase C) is used to correct the measured phase of the current through the busbar 80 (phase A). It is note that the measured phase can be compared to phase B if desired.

In FIG. 12, a graph of current as a function of time is shown, which includes a measured phase A current 140 through the busbar 80, a measured phase B current 142 through the busbar 82, and a measured phase C current 144 through the busbar 84. Each current is configured to be separated by a phase difference of 120 degrees.

To correct the measured phase A current 140, an expected phase A current 146 is determined by shifting the phase C current by the preconfigured phase separation. The expected current 146 is shifted based on the difference between the expected current and the measured phase A current, and a corrected phase A current 148 is determined to coincide with the expected current 146. An enlarged region of a portion of the measured current 140, the expected current 146 and the corrected current 148 is shown in a close-up view (denoted as 150).

In an embodiment, the phase A current is shifted based on the following equation:

$$I_{phase\ A\_corrected} = \alpha I_{phase\ A\_lagging} + \beta I_{phase\ C};\ \alpha >> \beta$$

where $I_{phase\ A\text{-}corrected}$ is the corrected phase A current 148, $I_{phase\ A\text{-}lagging}$ is the measured phase A current 140, and $I_{phase\ C}$ is the measured phase C current 144. Coefficients $\alpha$ and $\beta$ are tuned or selected based on the difference between the expected phase A current 146 and the measured phase A current 140. For example, the difference may be determined as a proportion or ratio of the phase separation and used to determine the coefficients. For example, a is equal to 1.118 and $\beta$ is equal to 0.2. In this way, a portion of another phase current is used to correct a measured phase current. It is noted that the coefficients can be predetermined and stored as a LUT or other data structure for various phase differences.

Figure 13:
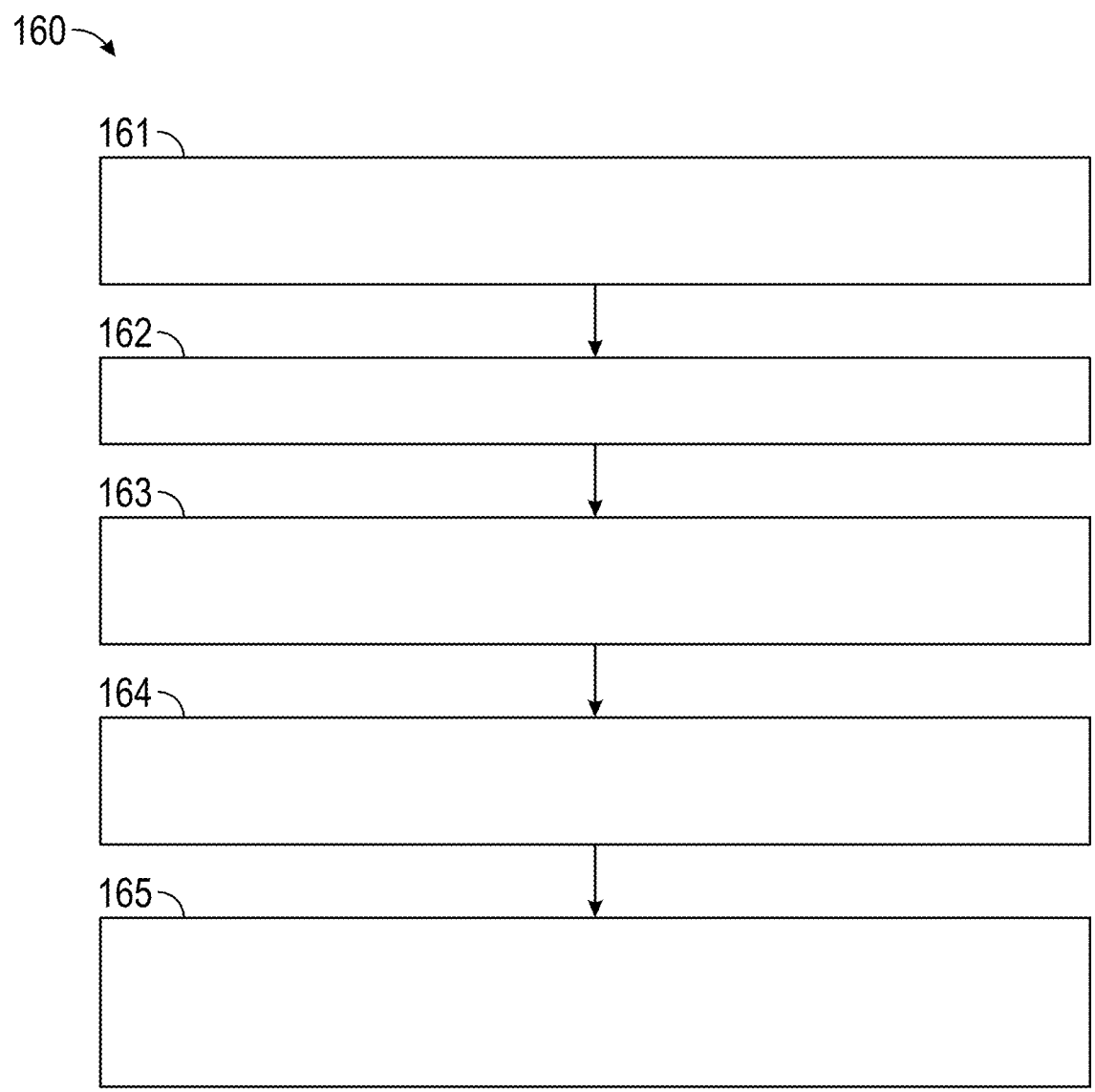
FIG. 13 is a flow diagram depicting aspects of a method of correcting a current measurement, in accordance with an exemplary embodiment.

FIG. 13 illustrates embodiments of a method 160 of measuring current and correcting a current measurement. The method 160 may be performed in conjunction with a vehicle conversion device, such as the inverter module 34. However, the method 160 is not so limited and may be used with any suitable electrical device or system. Aspects of the method 160 may be performed by a suitable processing device. In addition, the method 160 is discussed in conjunction with corrected current measurements from the phase A busbar 80; current measurements through the other busbars can be similarly corrected (separately or simultaneously).

The method 160 includes a number of steps or stages represented by blocks 161-165. The method 160 is not limited to the number or order of steps therein, as some steps represented by blocks 161-165 may be performed in a different order than that described below, or fewer than all of the steps may be performed. For example, blocks 162 through 165 can be performed simultaneously or concurrently.

At block 161, the inverter module 34 is operated and three-phase current is supplied to the motor 20 via the busbar assembly 100. Current through each of the busbars 80, 82 and 84 is measured.

At block 162, motor speed is determined and used to acquire a gain correction factor as discussed above. The gain correction factor may be acquired from an LUT based on the motor speed. At block 163, the gain correction factor is applied to the current measurements.

At block 164, the measured phase A current is compared to another phase current (e.g., the phase C current). The other phase current is referred to as a reference current. Based on the comparison, the coefficients $\alpha$ and $\beta$ are calculated, and the above equation is used to correct the measured phase A current.

At block 165, a current correction is applied by adjusting the magnitude of the phase A current over time using the coefficients and equation shown above. The phase A current, as corrected using the gain and phase correction, is referred to as a corrected current.

In an embodiment, the gain and phase correction are applied simultaneously in a single calculation process. For example, the correction can be performed using the following matrix equation:

$$\begin{bmatrix} I_a \\ I_b \\ I_c \end{bmatrix} = \begin{bmatrix} D_{xa} & D_{ya} & D_{za} \\ D_{xb} & D_{yb} & D_{zb} \\ D_{xc} & D_{yc} & D_{zc} \end{bmatrix} \begin{bmatrix} VB_x \\ VB_y \\ VB_z \end{bmatrix}$$

where I=D×VB, and Ia, Ib and Ic are current measurements. V is voltage, and Bx, By and Bz are magnetic field strength components. D is a function of frequency, and represents the phase correction and gain correction. $D_{xa}$, $D_{ya}$ and $D_{za}$ are components of D for phase A, $D_{xb}$, $D_{yb}$ and $D_{zb}$ are components of D for phase B, and $D_{xc}$, $D_{yc}$ and $D_{zc}$ are components of D for phase C.

Figure 14:
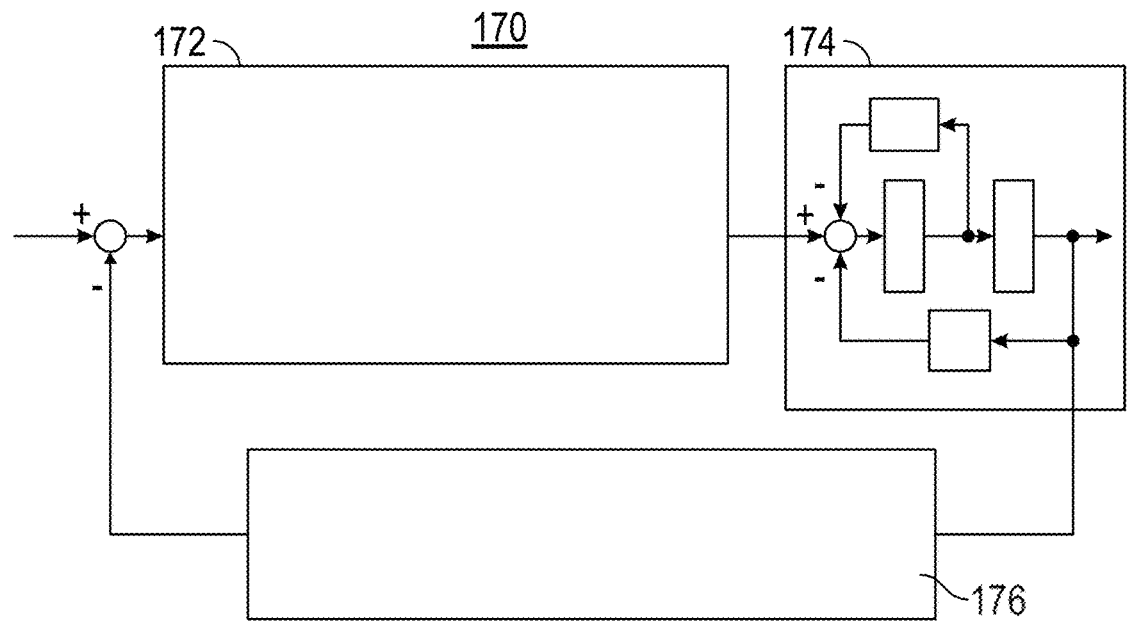
FIG. 14 depicts an example of a current regulator configured to correct current measurements.

FIG. 14 depicts an embodiment of a current regulator 170 configured with a lead lag compensator on the feedback, which may be used to correct current measurements using the gain and phase corrections discussed herein. The current regulator 170 includes a control circuit 172 and a load circuit 174 (R-L Load) representing an electric motor.

The control circuit regulates an input current (e.g., a phase A, B or C current measurement using tuning parameters Kp and Ki, which can be selected based on the gain correction factor and/or current adjustment based on phase error. The current regulator 170 may use a transfer function 176 as part of a feedback loop to perform corrections.

An example of a transfer function follows:

$$\frac{Y}{X} = \frac{(s-z_1)(s-z_2)}{(s-p_1)(s-p_2)},$$

where s is a complex variable, X is the input signal and Y is the output signal (i.e., output from RL load circuit 174). z and p are the zeros and poles, respectively, of the lead lag compensator.

As noted above, each current sensor may be individually positioned relative to a respective conductor based on magnetic field strength and cross coupling effects. This positioning can be achieved, for example, due to the correction methods described herein.

Figure 15:
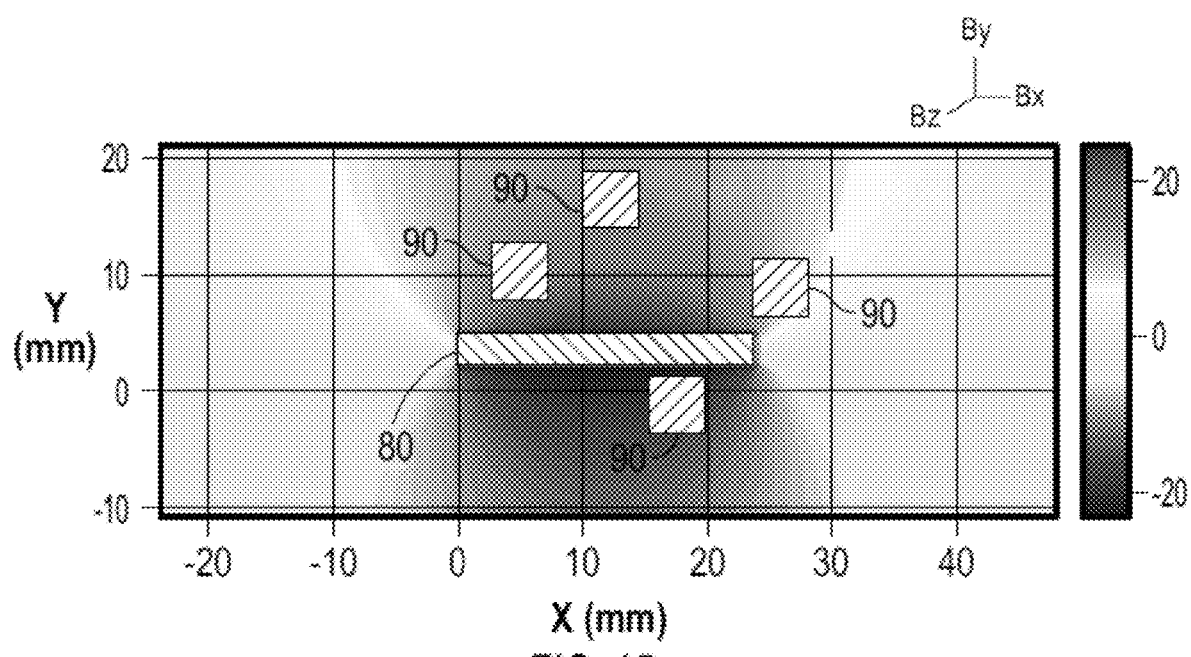
FIG. 15 depicts examples of positions of a current sensor relative to a conductor.
Figure 16:
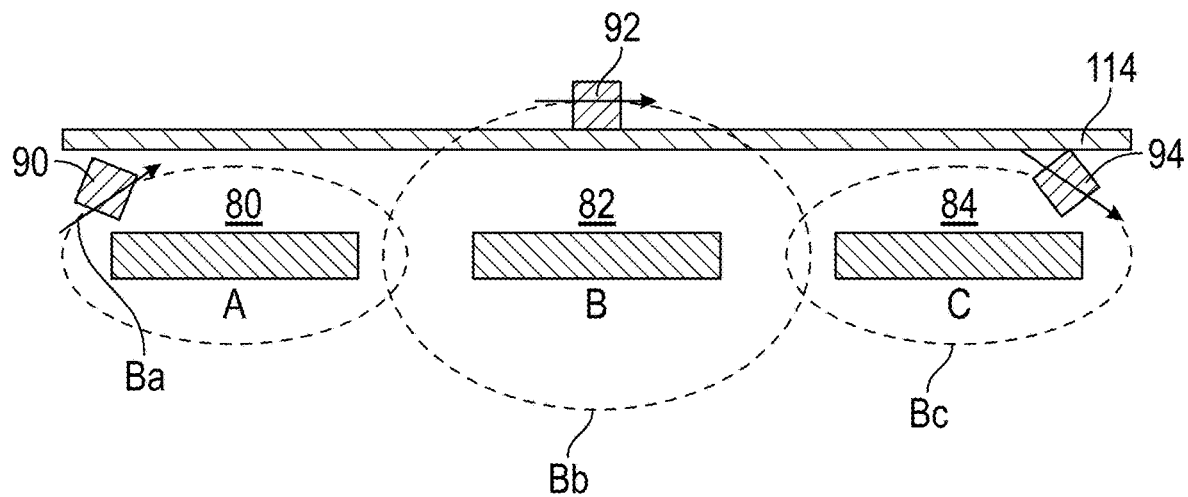
FIG. 16 depicts an example of positions of current sensors relative to conductors of the busbar assembly of FIG. 3.

FIGS. 15 and 16 depict examples of locations at which a current sensor can be located relative to a conductor. FIG. 15 depicts exemplary locations of the current sensor 90 relative to the busbar 80 in the x-y plane. Magnetic field strength is shown as a coding with an associated legend. As shown, the current sensor 90 can be placed above the busbar 80 in a region associated with high magnetic field strength, placed below, or placed at any other desired location.

FIG. 16 shows an example of positions of the sensors 90, 92 and 94 relative to the busbars 80, 82 and 84. The current sensor 92 is disposed above the busbar 82 and in the magnetic field Bb in a high magnetic field region. Current sensor 90 is positioned within magnetic field Ba in a location that balances the desire for high field strength and low cross coupling (i.e., in a high magnetic field region but away from cross coupling between fields Ba and Bb). Current sensor 94 is similarly positioned within magnetic field Bc. Accordingly, sensors can be individually positioned relative to each busbar in order to maximize field strength while also minimizing cross coupling.

Figure 17:
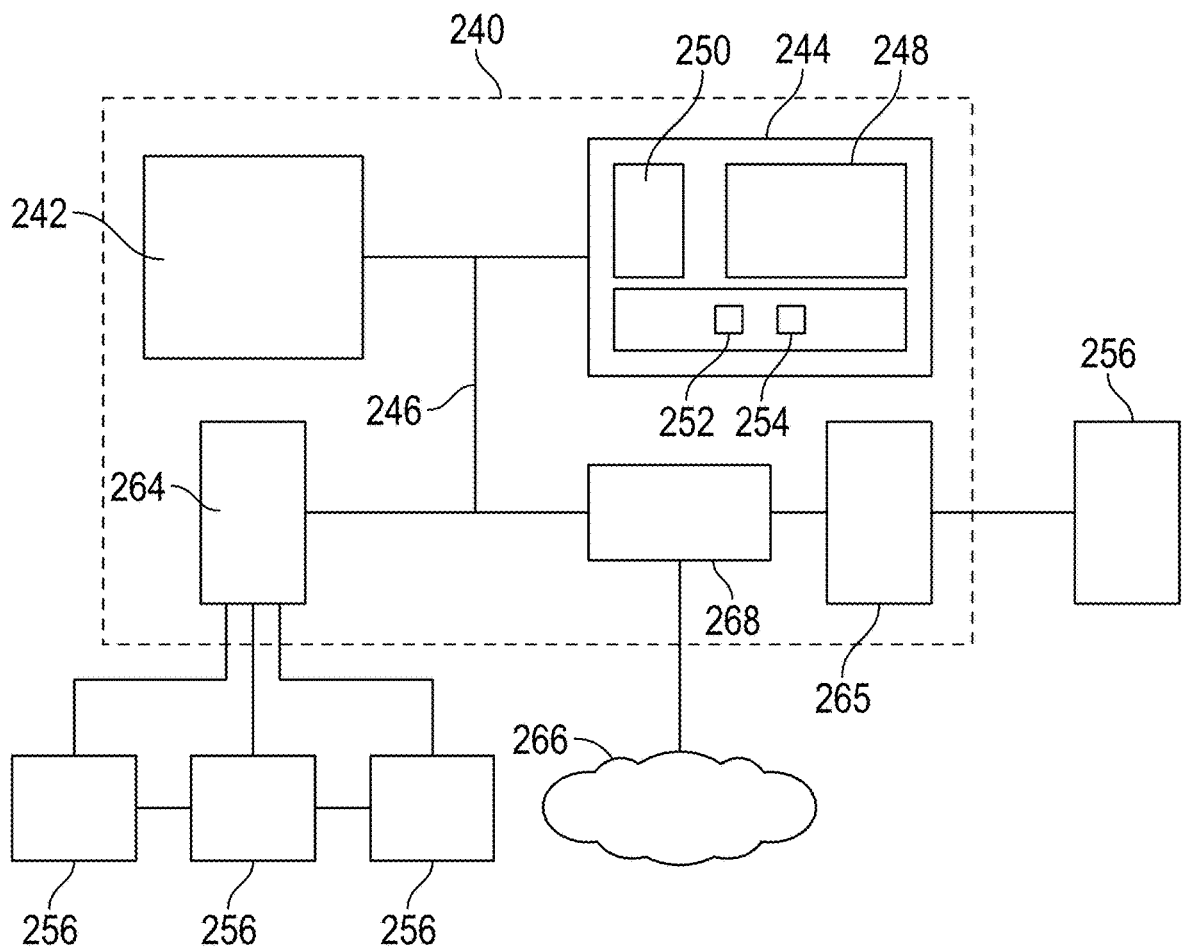
FIG. 17 depicts a computer system in accordance with an exemplary embodiment.

FIG. 17 illustrates aspects of an embodiment of a computer system 240 that can perform various aspects of embodiments described herein. The computer system 240 includes at least one processing device 242, which generally includes one or more processors for performing aspects of image acquisition and analysis methods described herein.

Components of the computer system 240 include the processing device 242 (such as one or more processors or processing units), a memory 244, and a bus 246 that couples various system components including the system memory 244 to the processing device 242. The system memory 244 can be a non-transitory computer-readable medium, and may include a variety of computer system readable media. Such media can be any available media that is accessible by the processing device 242, and includes both volatile and non-volatile media, and removable and non-removable media.

For example, the system memory 244 includes a non-volatile memory 248 such as a hard drive, and may also include a volatile memory 250, such as random access memory (RAM) and/or cache memory. The computer system 240 can further include other removable/non-removable, volatile/non-volatile computer system storage media.

The system memory 244 can include at least one program product having a set (e.g., at least one) of program modules that are configured to carry out functions of the embodiments described herein. For example, the system memory 244 stores various program modules that generally carry out the functions and/or methodologies of embodiments described herein. A module 252 may be included for performing functions related to performing current measurements and/or current regulation, and a module 254 may be included to perform functions related to correction of current measurements as discussed herein. The system 240 is not so limited, as other modules may be included. As used herein, the term "module" refers to processing circuitry that may include an application specific integrated circuit (ASIC), an electronic circuit, a processor (shared, dedicated, or group) and memory that executes one or more software or firmware programs, a combinational logic circuit, and/or other suitable components that provide the described functionality.

The processing device 242 can also communicate with one or more external devices 256 as a keyboard, a pointing device, and/or any devices (e.g., network card, modem, etc.) that enable the processing device 242 to communicate with one or more other computing devices. Communication with various devices can occur via Input/Output (I/O) interfaces 264 and 265.

The processing device 242 may also communicate with one or more networks 266 such as a local area network (LAN), a general wide area network (WAN), a bus network and/or a public network (e.g., the Internet) via a network adapter 268. It should be understood that although not shown, other hardware and/or software components may be used in conjunction with the computer system 40. Examples include, but are not limited to: microcode, device drivers, redundant processing units, external disk drive arrays, RAID systems, and data archival storage systems, etc.

While the above disclosure has been described with reference to exemplary embodiments, it will be understood by those skilled in the art that various changes may be made and equivalents may be substituted for elements thereof without departing from its scope. In addition, many modifications may be made to adapt a particular situation or material to the teachings of the disclosure without departing from the essential scope thereof. Therefore, it is intended that the present disclosure not be limited to the particular embodiments disclosed, but will include all embodiments falling within the scope thereof

What is claimed is:

1. A system for sensing current, comprising:
   a current sensor disposed proximate to a first conductor of a conductor assembly, the current sensor configured to measure a current through the first conductor and generate a first current measurement; and
   a correction module configured to receive the first current measurement from the current sensor and perform a correction method, the correction method including at least one of:
   determining a frequency of the first current measurement, and applying a gain correction factor to the first current measurement, the gain correction factor based on pre-characterization data relating a gain of a reference current sensor to current frequency, wherein the pre-characterization data is acquired based on at least one of measuring and simulating a reference current through the reference current sensor at a plurality of frequencies, and deriving a reference gain distribution; and
   determining a first phase of the first current measurement, acquiring a second current measurement of a second conductor of the conductor assembly, determining a second phase of the second current measurement, and applying a current adjustment to the first current measurement based on a temporal relationship between the first phase and the second phase.

2. The system of claim 1, wherein the current sensor is a point field detection (PFD) sensor.

3. The system of claim 1, wherein the conductor assembly is connected to a power supply and an electric motor, and the reference gain distribution is indicative of gain as a function of speed of the electric motor.

4. The system of claim 1, wherein the gain correction factor is applied based on a data structure storing a plurality of gain values, each gain value associated with a respective gain correction factor value.

5. The system of claim 1, wherein the temporal relationship is based on a difference between the first phase and an expected phase of the measured current, the expected phase determined based on a preconfigured phase separation between current applied through the first conductor and current applied through the second conductor.

6. The system of claim 1, wherein the correction module is configured to apply the gain correction factor and the current adjustment using at least one of a lead and lag filter and a current regulator.

7. The system of claim 1, wherein the current sensor is a magnetic field sensor.

8. The system of claim 1, wherein the current sensor is disposed at a location selected based on a strength of a magnetic field around the first conductor and a degree of cross-coupling between the first conductor and the second conductor.

9. A method of sensing current, comprising:
measuring a current through a first conductor of a conductor assembly by a current sensor disposed proximate to the first conductor, to generate a first current measurement; and
receiving the first current measurement at a correction module and performing a correction method, the correction method including at least one of:
determining a frequency of the first current measurement, and applying a gain correction factor to the first current measurement, the gain correction factor based on pre-characterization data relating a gain of a reference current sensor to current frequency, wherein the pre-characterization data is acquired based on at least one of measuring and simulating a reference current through the reference current sensor at a plurality of frequencies, and deriving a reference gain distribution; and
determining a first phase of the first current measurement, acquiring a second current measurement of a second conductor of the conductor assembly, determining a second phase of the second current measurement, and applying a current adjustment to the first current measurement based on a temporal relationship between the first phase and the second phase.

10. The method of claim 9, wherein the current sensor is a point field detection (PFD) sensor.

11. The method of claim 9, wherein the conductor assembly is connected to a power supply and an electric motor, and the reference gain distribution is indicative of gain as a function of speed of the electric motor.

12. The method of claim 9, wherein the gain correction factor is applied based on a data structure storing a plurality of gain values, each gain value associated with a respective gain correction factor value.

13. The method of claim 9, wherein the temporal relationship is based on a difference between the first phase and an expected phase of the measured current, the expected phase determined based on a preconfigured phase separation between the current applied through the first conductor and current applied through the second conductor.

14. The method of claim 9, wherein the gain correction factor and the current adjustment are applied using at least one of a lead and lag filter and a current regulator.

15. The method of claim 9, wherein the current sensor is a magnetic field sensor, and the current sensor is disposed at a location selected based on a strength of a magnetic field around the conductor and a degree of cross-coupling between the first conductor and the second conductor.

16. A vehicle system comprising:
a memory having computer readable instructions; and
a processing device for executing the computer readable instructions, the computer readable instructions controlling the processing device to perform a method including:
measuring a current through a first conductor of a conductor assembly by a current sensor disposed proximate to the first conductor, to generate a first current measurement; and
receiving the first current measurement at a correction module and performing a correction method, the correction method including at least one of:
determining a frequency of the first current measurement, and applying a gain correction factor to the first current measurement, the gain correction factor based on pre-characterization data relating a gain of a reference current sensor to current frequency, wherein the pre-characterization data is acquired based on at least one of measuring and simulating a reference current through the reference current sensor at a plurality of frequencies, and deriving a reference gain distribution; and
determining a first phase of the first current measurement, acquiring a second current measurement of a second conductor of the conductor assembly, determining a second phase of the second current measurement, and applying a current adjustment to the first current measurement based on a temporal relationship between the first phase and the second phase.

17. The vehicle system of claim 16, wherein the current sensor is a point field detection (PFD) sensor.

18. The vehicle system of claim 16, wherein the conductor assembly is connected to a power supply and an electric motor, and the reference gain distribution is indicative of gain as a function of speed of the electric motor.

19. The vehicle system of claim 16, wherein the gain correction factor is applied based on a data structure storing a plurality of gain values, each gain value associated with a respective gain correction factor value.

20. The vehicle system of claim 16, wherein the temporal relationship is based on a difference between the first phase and an expected phase of the measured current, the expected phase determined based on a preconfigured phase separation between the current applied through the first conductor and current applied through the second conductor.

\* \* \* \* \*